Sept. 10, 1968 J. M. GAULT 3,401,317

FUSED SEMICONDUCTOR DEVICE

Filed July 11, 1966

INVENTOR.
JOHN M. GAULT

BY

Ostrolenk, Faber, Gerb + Soffen

ATTORNEYS

United States Patent Office 3,401,317

Patented Sept. 10, 1968

3,401,317

FUSED SEMICONDUCTOR DEVICE

John M. Gault, Manhattan Beach, Calif., assignor to International Rectifier Corporation, El Segundo, Calif., a corporation of California Filed July 11, 1966, Ser. No. 564,293
4 Claims. (Cl. 317—234)

This invention relates to semiconductor devices, and more specifically relates to the provision of a fuse means which substantially directly follows the temperature of a semiconductor wafer being protected whereby the fuse interrupts current through the semiconductor wafer when a predetermined wafer temperature is reached.

It is well known to protect various types of semiconductor devices, typically diodes, with suitable fuses which interrupt current through the device responsive to predetermined current magnitudes. Such fuse arrangements, although often provided to protect other circuit components, are also commonly used to protect the device itself in the event of some failure within the circuit.

Normally, the fuse is provided as a component separate from the semiconductor device being protected. Therefore, the fuse will be rated to interrupt the circuit after some predetermined forward current is reached which is typically from five to six times the normal forward current of a rectifier device. This, however, under different conditions, may not necessarily be related to the amount of heating applied directly to the semiconductor wafer so that, even though the fuse circuit operates properly, the semiconductor device being protected can be damaged or destroyed.

In particular, the overheating of a semiconductor wafer having one or more junctions therein can be caused by a variety of effects which would not be reflected in a forward current through the fuse which is commonly used as the parameter for causing the fuse operation. For example, if a fuse is connected in series with a rectifier and is designed to interrupt the circuit at five times the current rating of the rectifier, a current overload three or four times the current rating of the rectifier (flowing for a fairly short period of time) will not blow the fuse, but will cause heating of the semiconductor wafer. The heating due to this forward current in itself may not damage the rectifier. It will, however, cause an increase in reverse leakage current through the wafer which will, in turn, cause substantial additional heating of the rectifier. In fact, if the leakage current increases to even a small fraction of the forward rated current of the device, a "thermal runaway condition" can occur which will destroy the device even after the forward overload has stopped, assuming it has not lasted for a sufficiently long time to operate the fuse.

For these and a variety of other thermal conditions not related to forward current which could operate upon the junction of a semiconductor device, there are serious inadequacies in the fuse protection commonly used for semiconductor devices.

The principle of the present invention is to provide a novel fuse arrangement for protection of semiconductor devices in which the fusible member is in direct thermal contact with the wafer being protected, whereupon the fusible member will follow a temperature curve substantially identical to that of the wafer. Therefore, the fuse will be operated under some predetermined temperature condition of the wafer which is a more accurate representation of the ability of the rectifier element to remain in service.

More specifically, and in accordance with the invention, a spring member, which is made a part of the current conducting path through a semiconductor wafer, is connected to the wafer expansion plate in a strained condition by a suitable low temperature solder. The wafer expansion plate will have substantially the same temperature as will the wafer connected thereto, whereupon the solder retaining the fuse spring member against the expansion plate will melt at some predetermined temperature which becomes dangerous to the wafer. The strained spring member, after the solder has melted, will then return to its normal position which will interrupt current flow through the wafer since this spring member is a portion of the current conduction path.

Accordingly, a primary object of this invention is to provide a novel fuse structure for semiconductor devices.

Yet another object of this invention is to provide a novel structure whereby a fuse can be built directly into the housing of a semiconductor device which will directly follow the temperature characteristics of the wafer and will be responsive thereto.

Still another object of this invention is to provide a novel fuse subassembly which can be built into a semiconductor housing and can be easily removed therefrom after its operation to permit the replacement of a new fuse element.

These and other objects of this invention will become apparent from the following description when taken in connection with the drawings, in which.

Figure 1:
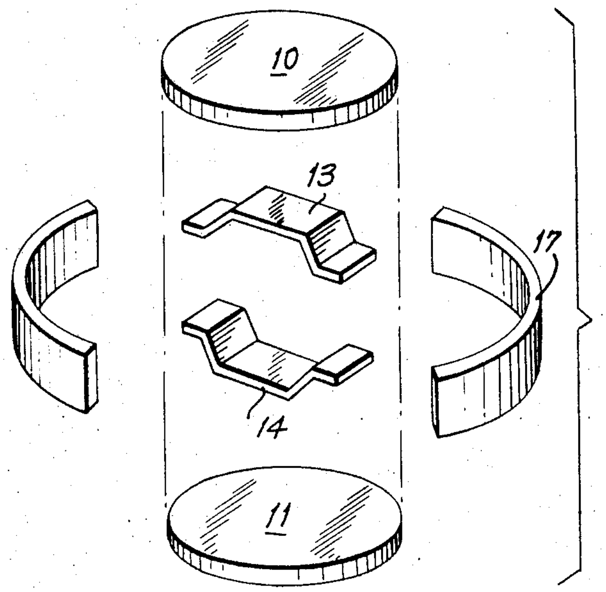
FIGURE 1 is an exploded perspective view of the fuse subassembly constructed in accordance with the present invention.
Figure 2:
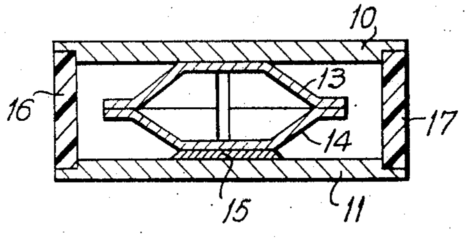
FIGURE 2 is a cross-sectional view of the assembled fuse of FIGURE 1 with the spring members in their current carrying position.
Figure 3:
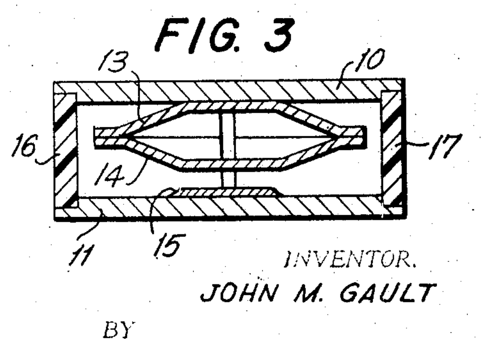
FIGURE 3 is a cross-sectional view similar to FIGURE 2 illustrating the contracted position of the spring after the fusing solder has been melted by a wafer temperature which exceeds some predetermined value.

Referring first to FIGURES 1, 2 and 3, there is illustrated therein a novel fuse subassembly which is comprised of upper and lower conductive disks 10 and 11 which may be of copper and which contain two spring-shaped members 13 and 14 which are joined to one another at their outer ends in any desired manner as by brazing.

The upper surface of spring member 13 is then brazed, as shown in FIGURES 2 and 3, to the lower surface of plate 10. The lower surface of spring 14, however, is soldered to the upper surface of plate 11 by a suitable soft solder mass 15 which typically could be tin which melts at about 227° C.

After spring members 13 and 14 are secured between plates 10 and 11, the plates are moved away from one another to extend springs 13 and 14 and place them in a strained condition. Insulator segments such as insulation cylinder halves 16 and 17 are then interposed between plates 10 and 11 to hold the plates in their extended position. If desired, the interior volume between plates 10 and 11 can be filled with a suitable arc extinguishing gas such as sulfurhexafluoride and the gaps between insulator halves 16 and 17 can be plugged by a suitable insulation compound which will retain the arc extinguishing fluid in the interior of the fuse housing.

The springs 13 and 14 in their normal and unstressed position will assume the configuration shown in FIGURE 3 which corresponds to a fuse operative condition. Preferably, a gap of at least ¼ inch should exist between the free bottom of spring 14 and plate 11 after fuse operation.

Figure 4:
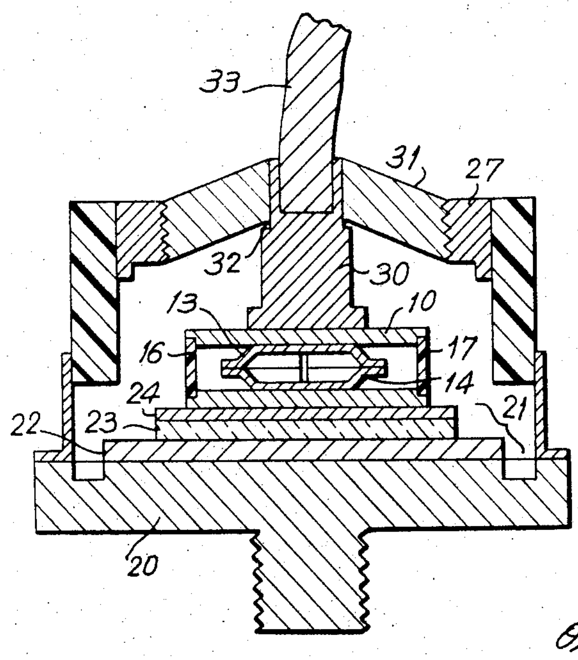
FIGURE 4 illustrates the manner in which the fuse assembly of FIGURES 1, 2 and 3 can be incorporated into a compression bonded type semiconductor housing structure.

The entire subassembly of FIGURES 1, 2 and 3 may then be contained within the interior of a semiconductor housing, as illustrated in FIGURE 4. Referring now to FIGURE 4, there is illustrated therein a compression bonded type of semiconductor housing assembly which includes a conductive stud 20 which carries a semiconductor wafer assembly 21 which consists of a lower molybdenum expansion plate 22, a silicon wafer 23 having a junction therein (to form a rectifier) or a plurality of junctions to form other types of devices, and an upper molybdenum expansion plate 24.

A steel ring 25 brazed to the outer periphery of stud 20 is suitably secured to an insulation cylinder 26 which carries a threaded metallic ring 27 at its upper end.

In accordance with the invention, plate 11 of the subassembly of FIGURES 1, 2 and 3 is then positioned directly atop expansion plate 24 and the subassembly is held in position by the conductive pressure stud 30 which is forced downwardly by the screw fitting 31 threaded into ring 27 and engaging shoulder 32 of stud 30. Stud 30 then has the usual extending pigtail 33 which serves as one terminal of the device, while stud 20 serves as the other terminal of the device.

The screw fitting 31 is tightened sufficiently to cause good thermal and electrical connection between stud 30 and plate 10 and plate 11 and expansion plate 24 of the semiconductor wafer assembly 21. Therefore, current flow can extend from stud 20 through assembly 21 to plate 11 and thence through springs 14 and 13 to plate 10 and stud 30.

The low melting temperature solder 14 of FIGURES 2 and 3 will now respond substantially directly to the temperature of wafer 23, whereupon when the temperature of wafer 23 reaches some predetermined value, the solder 15 will soften sufficiently to permit the inward collapse of springs 13 and 14 and thus the interruption of current through wafer 23.

Note that since the arrangement is a compression bonded arrangement, after the fuse has been operated, a new fuse can be placed in position by removing fitting 31 and lifting out the operated fuse and thereafter replacing and compression bonding a new fuse in its place.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows.

I claim:

1. A fuzed semiconductor device comprising; a spring member having a normal position and a deflected position: a first and second spaced insulated conductive disks on respective opposite sides of said spring member; a first and second terminal member insulated from one another, and a semiconductor wafer mounted between first and second expansion plates, said first expansion plate electrically and mechanically connected to said first terminal member; a first portion of said spring member mechanically and electrically connected to said first conductive disk; a low melting temperature solder; a second portion of said spring deflected from its said normal position and toward said deflected position and soldered to said second conductive disk; said second conductive disk electrically and mechanically connected to said second expansion plate; said first expansion plate mechanically and electrically connected to said second terminal member; said low melting temperature solder melting at a temperature related to a maximum permissible temperature for said wafer.

2. The device as set forth in claim 1 which includes an insulation spacer extending around the peripheries of said first and second conductive disks to hold said first and second conductive disks away from one another against the biasing force of said spring member in its said deflected position.

3. The device as set forth in claim 2 which includes clamping means for removably clamping said first and second conductive disks, said wafer and said first and second expansion plates between said first and second terminal members.

4. The device as set forth in claim 3 wherein said spring member includes a flat conductive spring having first and second reentrant bends at its opposite ends; the central portion of said spring soldered to the center of said second conductive disk.

No references cited.

JOHN W. HUCKERT, *Primary Examiner.*

R. F. POLISSACK, *Assistant Examiner.*